United States Patent
Geiger et al.

(10) Patent No.: US 9,618,400 B2
(45) Date of Patent: Apr. 11, 2017

(54) TEMPERATURE DETECTION CIRCUIT FOR A MAGNETIC SENSOR

(71) Applicant: Allegro Microsystems, LLC, Worcester, MA (US)

(72) Inventors: Benjamin Geiger, Manchester, NH (US); Devon Fernandez, Londonderry, NH (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 244 days.

(21) Appl. No.: 14/620,533

(22) Filed: Feb. 12, 2015

(65) Prior Publication Data
US 2016/0238462 A1    Aug. 18, 2016

(51) Int. Cl.
| | | |
|---|---|---|
| G01R 33/02 | (2006.01) | |
| G01R 21/14 | (2006.01) | |
| G01B 7/30 | (2006.01) | |
| G01K 13/00 | (2006.01) | |
| G01R 33/00 | (2006.01) | |
| G01K 3/00 | (2006.01) | |
| G01K 7/01 | (2006.01) | |

(52) U.S. Cl.
CPC ............. *G01K 13/00* (2013.01); *G01K 3/005* (2013.01); *G01K 7/01* (2013.01); *G01R 33/007* (2013.01)

(58) Field of Classification Search
CPC ........................................................ G01B 7/30
USPC ............................................ 324/207.25, 244
See application file for complete search history.

(56) References Cited

U.S. PATENT DOCUMENTS

| | | | |
|---|---|---|---|
| 2002/0097040 A1* | 7/2002 | Takizawa et al. ............ 324/174 |
| 2006/0017433 A1* | 1/2006 | Hattori ..................... 324/207.25 |
| 2012/0133356 A1* | 5/2012 | Charlier et al. .............. 324/202 |
| 2014/0320119 A1* | 10/2014 | Tsuge et al. ............. 324/207.25 |

* cited by examiner

*Primary Examiner* — Bot Ledynh
(74) *Attorney, Agent, or Firm* — Daly, Crowley, Mofford & Durkee, LLP (57) ABSTRACT

In one aspect, a temperature detection circuit includes a first circuit configured to provide a first signal and a comparator circuit configured to provide a warning signal in response to the first signal if a temperature reaches a temperature value. The first signal enables determination of a parameter of a magnetic sensor.

21 Claims, 5 Drawing Sheets

TEMPERATURE DETECTION CIRCUIT FOR A MAGNETIC SENSOR

BACKGROUND

Various types of magnetic field sensing elements are known, including Hall effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field, or, in some embodiments, fluctuations of the magnetic field associated with the magnet. In the presence of a moving ferromagnetic object, the magnetic field signal sensed by the magnetic field sensor varies in accordance with a shape or profile of the moving ferromagnetic object.

Magnetic field sensors are often used to detect movement of features of a ferromagnetic gear, such a gear tooth and/or gear slots. A magnetic field sensor in this application is commonly referred to as a "gear tooth" sensor.

In some arrangements, the gear is placed upon a target object, for example, a camshaft in an engine, thus it is the rotation of the target object (e.g., camshaft) that is sensed by detection of the moving features of the gear. Gear tooth sensors are used, for example, in automotive applications to provide information to an engine control processor for ignition timing control, fuel management, wheel speed and other operations.

SUMMARY

In one aspect, a temperature detection circuit includes a first circuit configured to provide a first signal and a comparator circuit configured to provide a warning signal in response to the first signal if a temperature reaches a temperature value. The first signal enables determination of a parameter of a magnetic sensor.

In another aspect, a magnetic sensor includes a magnetic field sensing circuit includes a magnetic field sensing element coupled to an electronic circuit configured to generate an output signal, a magnet configured to generate opposing magnetic fields, a first circuit configured to provide a first signal to enable determination of a parameter of the magnetic sensor and a comparator circuit configured to provide a warning signal in response to the first signal if a temperature reaches a temperature value. The magnetic sensor is configured to generate the output signal in response to the magnetic fields interacting with gear teeth.

DESCRIPTION OF THE DRAWINGS

The foregoing features of the invention, as well as the invention itself may be more fully understood from the following detailed description of the drawings, in which.

DETAIL DESCRIPTION

Described herein is a temperature sensor that may be used in a system where temperature changes are critical. For example, in automotive systems, diverse external weather conditions as well as internal chemical, mechanical, and electrical processes may cause a wide range of potential operating temperatures for each element of the system. Although automotive systems are designed for these operating temperatures, extraordinary or erroneous operating conditions may result in temperatures outside the expected range. As a result, the system may operate in an incorrect or dangerous manner. For example, temperatures that exceed an acceptable temperature range will alter the reliability of magnetic sensors used in critical automotive systems such as braking systems. To mitigate this risk, a temperature sensor as described herein may be added to automotive systems. Processing and control modules in the vehicle, such as those that use magnetic sensors, for example, can use the temperature sensor described herein to mitigate erroneous system behavior at temperatures beyond specification or, in the worst case, to inform the operator of a concern.

Before describing the present disclosure, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

A "circular vertical Hall" (CVH) sensing element, which includes a plurality of vertical magnetic field sending elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sending element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

While a Planar Hall element is described in examples below, it should be appreciated that the same or similar techniques and circuits apply to any type of magnetic field sending elements.

A "true power on state" (TPOS) detector as used in an automobile is described below. However, it should be apparent that the same techniques and similar circuits can be used with any type of magnetic field sensor used in any application.

Examples below describe a particular TPOS cam as may be used upon an engine camshaft target object. However, similar circuits and techniques can be used with other cams or gears disposed upon the engine camshaft, or upon other rotating parts of an engine (e.g., crank shaft, transmission hear, anti-lock braking system (ABS)), or upon rotating parts of a device that is not an engine.

As used herein, the phrase "area of maximum field activity" is used to describe a region in space for which a magnetic field is most influenced in angle and/or magnitude by proximity of a soft ferromagnetic material (or high permeability material, where high means it sufficiently reduces the reluctance path of the magnetic flux for a given application) object. In other examples, a rotating target can be a hard ferromagnetic material for use in a wheel speed sensor, for example.

Figure 1:
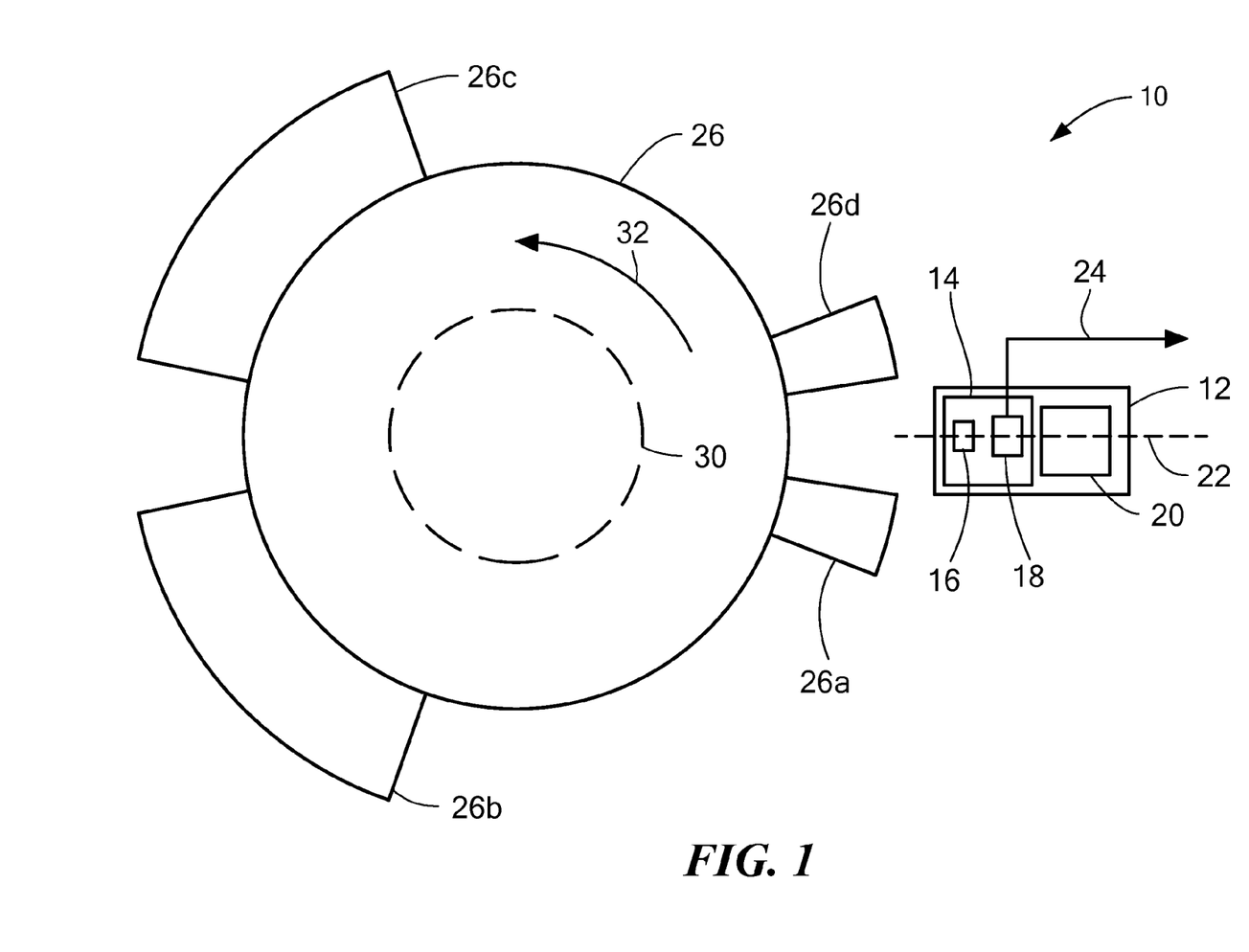
FIG. 1 is block diagram of an example of a circuit that includes a "true power on state" (TPOS) detector.

Referring to FIG. 1, an exemplary TPOS detector arrangement 10 includes a TPOS detector 12. The TPOS detector 12 includes a magnetic field sensing circuit 14 having a magnetic field sensing element 16 (e.g., a Hall sensing element) coupled to an electronic circuit 18 (In one example, the electronic circuit 18 is an integrated circuit (IC) or die. The orientation of the die depicted in FIG. 1 may not be optimal for a planar Hall transducer but may be optimal for other transducer types). The TPOS detector 12 also includes a magnet 20. The magnet 20 is configured to generate opposing magnetic fields parallel to an axis 22. The electronic circuit 18 is configured to generate a TPOS output signal 24.

The TPOS detector arrangement 10 can also include a TPOS target 26 having features (e.g., a feature 26a, a feature 26b, a feature 26c, a feature 26d). Each feature 26a-26d is a soft ferromagnetic object. In one example, the elements 26a-26d may be made in a hard ferromagnetic material (or a permanent magnet material) by changing the direction of the magnetization of the hard ferromagnetic material locally. In this example, the TPOS target or TPOS cam 26 may not have physical features 26a-26d but magnetic features that change the magnetic flux or magnetic field as the TPOS target 26 rotates. In one example, the features 26a-26d are gear teeth. The TPOS target 26 can be disposed, for example, upon a shaft 30 (i.e., a target object) configured to rotate in a direction 32, shown as counterclockwise but it may also rotate in the clockwise direction or be bi-directional.

Another example would be to use a non-ferromagnetic material of high conductivity (e.g., aluminum), which when rotated in the presence of a magnetic field provided by a back-biased sensor as shown in FIG. 1 the eddy current induced in the target 26 changes and therefore the magnetic flux is changed at the sensor element 14. This type of sensor may have features cut into the aluminum or high conductivity material such that the eddy current may be optimized for a given air gap or other attribute of the application.

In operation, as the TPOS target 26 rotates, the target features 26a-26d modulate the magnetic flux (also referred to herein as magnetic field) that may be sensed by the sensing element 16. Modulations of the magnetic flux generated by the magnet 20 are sensed by the magnetic field sensing element 16 and result in state transitions in the TPOS output signal 24.

Particular arrangement and spacing of the cam features 26a-26d results in the TPOS detector 12 being able to provide the TPOS output signal 24 having transitions without rotation of the target or after only a small number of degrees of rotation of the TPOS target 26, which can be interpreted by the engine control computer to generate an absolute angle of rotation of the TPOS target 26 and of the shaft 30 upon which the TPOS target 26 is disposed.

Figure 2:
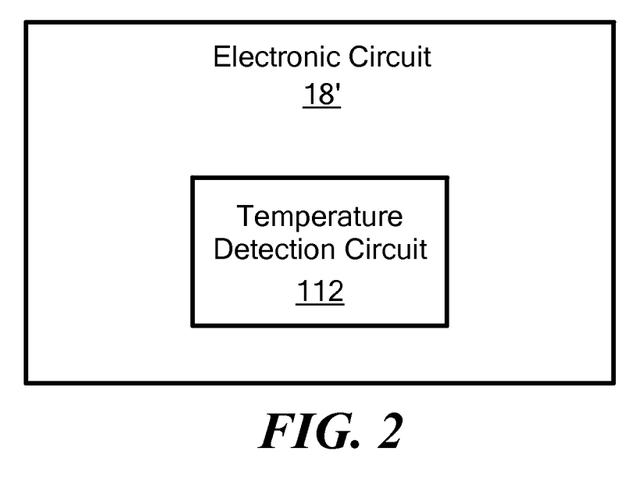
FIG. 2 is an example of block diagram of an electronic circuit in the TPOS detector of FIG. 1.

Referring to FIG. 2, an example of the electronic circuit 18 is an electronic circuit 18'. The electronic circuit 18' includes a temperature detection circuit 112. In one example, the temperature detection circuit 112 detects changes in temperature. In particular, the temperature detection circuit outputs a warning when the temperature exceeds temperature limits (e.g., the temperature is too cold or too hot). While FIG. 3 depicts both the thermal voltage reference circuit 122 and the junction voltage reference circuit 124 together, a temperature detection circuit may be fabricated that uses only one of the thermal voltage reference circuit 122 or the junction voltage reference circuit 124 to detect temperature changes.

Figure 3:
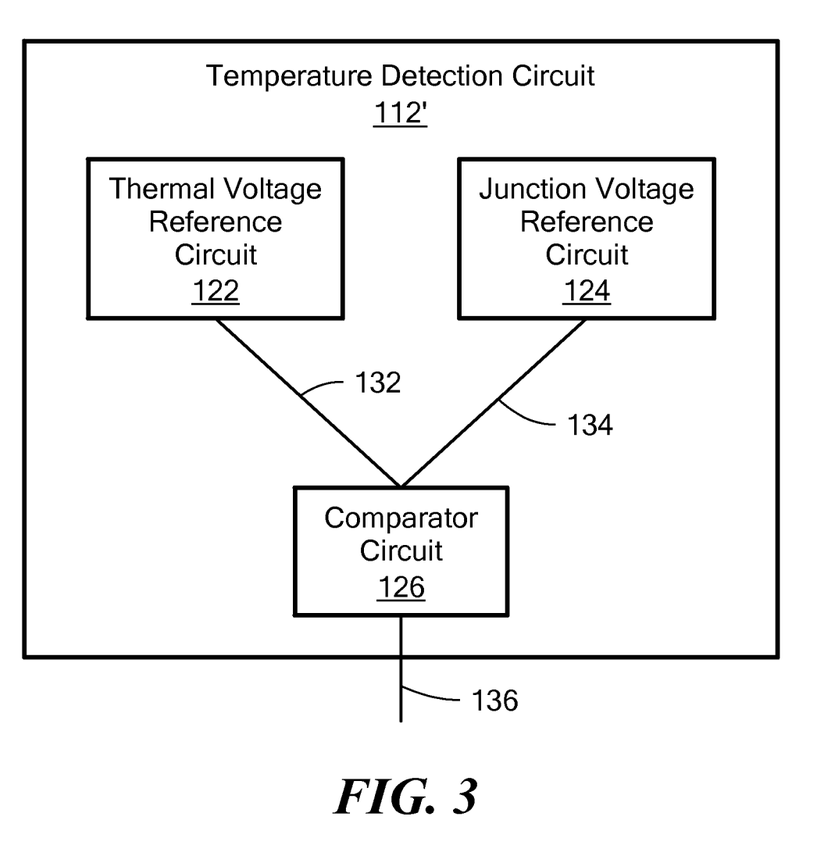
FIG. 3 is block diagram of an example of a thermal detection circuit.

Referring to FIG. 3, an example of a temperature detection circuit 112 is a temperature detection circuit 112'. The temperature detection circuit includes a thermal voltage reference circuit 122, a junction voltage reference circuit 124 and a comparator circuit 126. The thermal voltage reference circuit 122 provides a proportional-to-absolute-temperature (PTAT) current 132 and the junction voltage reference circuit 124 provides a complementary-to-absolute-temperature (CTAT) current 134. As will be described further herein, the PTAT current 132 and the CTAT current 134 change with temperature.

The PTAT current 132 and the CTAT current 134 are inputs to a comparator circuit 126. The comparator circuit 126 provides an output signal 136. If the temperature exceeds a certain temperature limit (e.g., the temperature exceeds a predetermined temperature or the temperature goes below a predetermined temperature), the output signal 136 will provide a warning indicator (e.g., a pulse signal, transition from a low to a high voltage and so forth).

In some examples, the PTAT current 132 and/or the CTAT current 134 may be used to compensate the temperature response of magnetic signal detection. For example, the CTAT current value or the PTAT current value may be multiplied by some fixed coefficient in order to determine the gain of a magnetic sensor. While the gain of the magnetic sensor is one magnetic sensor parameter that can be determined, one of ordinary skill in the art may use the PTAT or the CTAT current or some other electrical characteristic to determine other magnetic sensor parameters to compensate for temperature changes such as, for example, signal offset.

In some examples, the PTAT current 132 and/or CTAT current 134 may be used to determine multiple temperature limits or any arbitrary resolution of temperature information (e.g., every one degree boundary).

Figure 4:
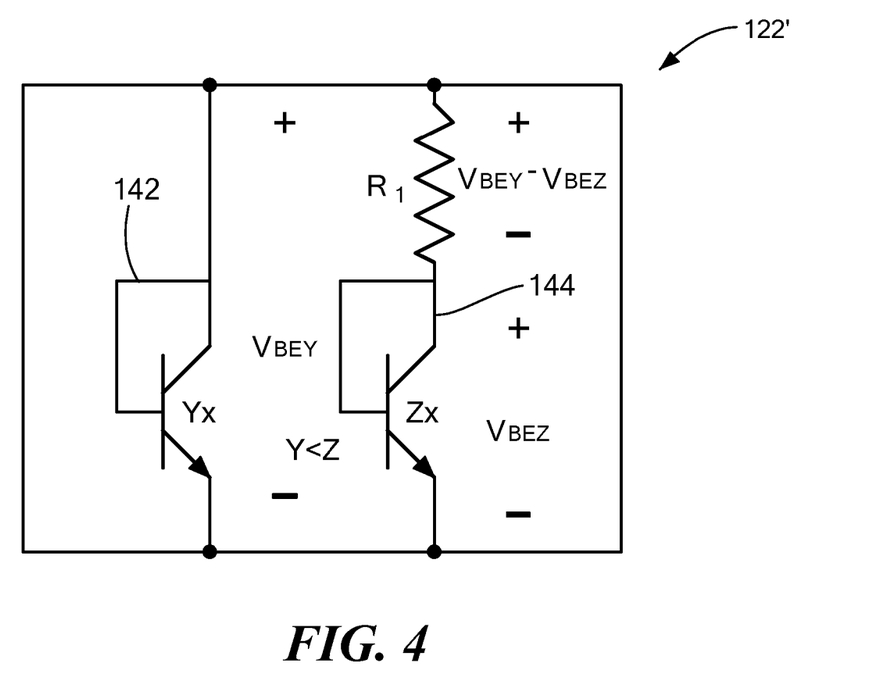
FIG. 4 is block diagram of an example of a thermal voltage reference circuit.

Referring to FIG. 4, an example of the thermal voltage reference circuit 122 is a thermal voltage reference circuit 122'. The thermal voltage reference circuit 122' includes a first branch with a first transistor 142 in parallel with a second branch with a resistor, $R_1$, and a second transistor 144. The first transistor 142 is larger than the second transistor 144 (e.g., the first transistor 142 has a larger base-emitter junction area than the second transistor 142 has.) In one example, the transistors 142, 144 are bipolar junction transistors (BJTs). In one particular example, the transistors 142, 144 are npn BJTs with the collector tied to the base as shown in FIG. 4.

The voltages and currents for each branch are configured to be matched. For example, if the voltage over the transistor 142 is $V_{BEY}$ and the voltage over the transistor 144 is $V_{BEZ}$, then the current over the resistor, $R_1$, is equal to $(V_{BEY}-V_{BEZ})/R_1$, which is equal to the PTAT current 132. As temperature changes, the electronic characteristics of the transistors 142, 144 and the resistor, $R_1$, also change. That is, the voltages $V_{BEY}$, $V_{BEZ}$ and the resistance, $R_1$, change with temperature and therefore PTAT current 132 changes with temperature.

Figure 5:
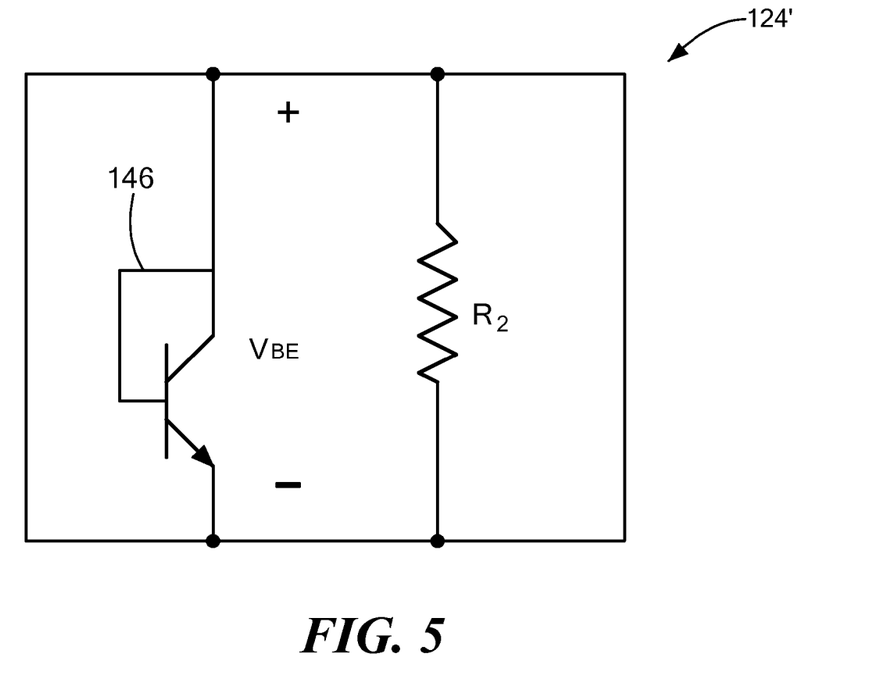
FIG. 5 is block diagram of an example of a junction voltage reference circuit.

Referring to FIG. 5, an example of the junction voltage reference circuit 124 is a junction voltage reference circuit 124'. The junction voltage reference circuit 124' includes a first branch with a first transistor 146 in parallel with a second branch with a resistor, $R_2$. In one example, the transistor 146 is a bipolar junction transistor (BJT). In one particular example, the transistor 146 is an npn BJT with the collector tied to the base as shown in FIG. 5. Because resistors also change with temperature the resistor, $R_2$ is substantially equal in temperature response as the resistor, $R_1$. In one particular example, $R_1$ and $R_2$ are the same type of resistor.

The voltages and currents for each branch are configured to be matched. For example, if the voltage over the transistor 146 is $V_{BE}$, then the current over the resistor, $R_2$, is equal to $V_{BE}/R_2$, which is equal to the CTAT current 134. As temperature changes, the electronic characteristics of the transistor 146 and the resistor, $R_2$, also change. That is, the voltage $V_{BE}$ and the resistance, $R_2$, change with temperature and therefore CTAT current 134 changes with temperature.

Figure 6:
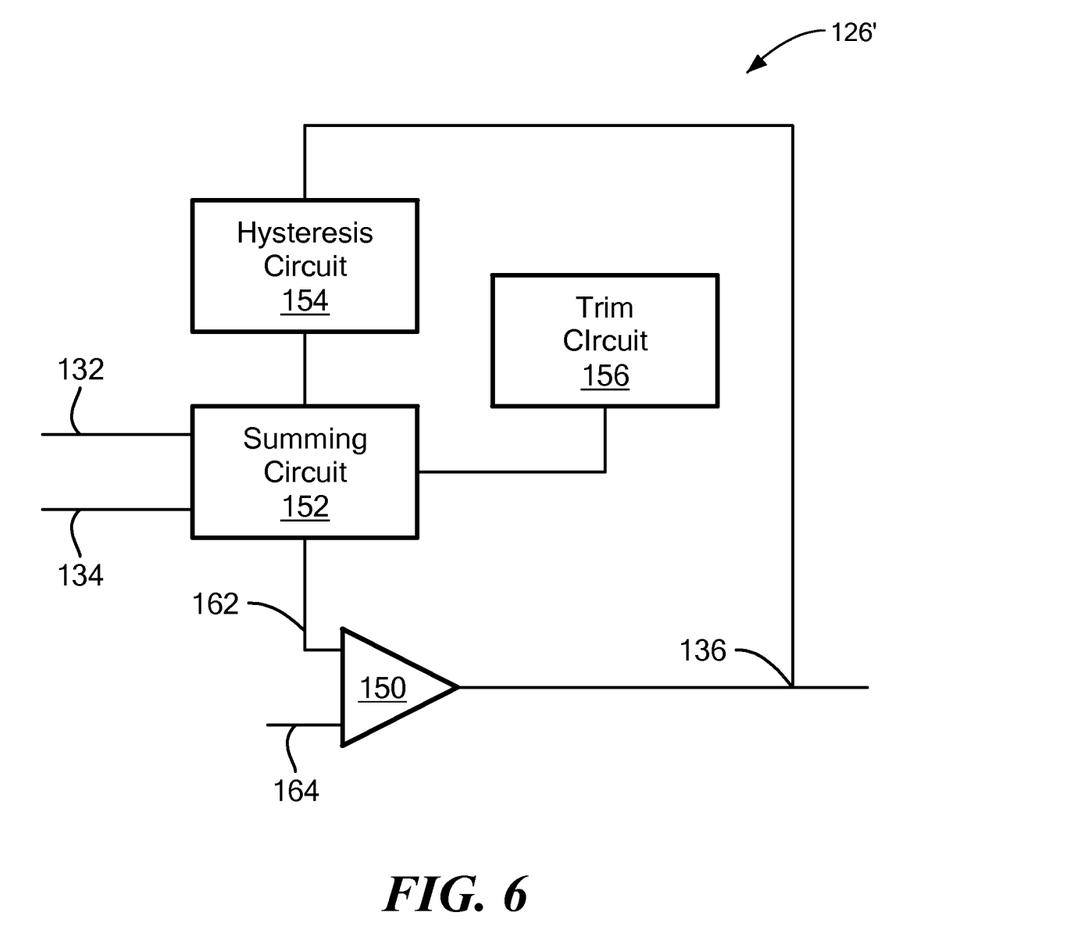
FIG. 6 is block diagram of an example of a comparator circuit.

Referring to FIG. 6, an example of the comparator circuit 126 is a comparator circuit 126'. While FIG. 6 depicts both the PTAT current 132 and the CTAT current 134 together, a comparator circuit that uses only one of the PTAT current 132 or the CTAT current 134 may be used in other embodiments.

The comparator circuit 126' includes a differential amplifier 150, a summing circuit 152, a hysteresis circuit 154 and a trim circuit 156 configured to provide trim. The summing circuit 152 sums the PTAT current 132, the CTAT current 134, current from the hysteresis circuit 154 and current from the trim circuit 156 and provides the sum as an input signal 162 to the differential amplifier 150. The differential amplifier 150 also receives a second input signal 164. In one example, the second input signal 164 is zero volts.

In one example, the PTAT current 132 functions as a current source while the CTAT current 134 functions as a current sink. When the PTAT current 132 and the CTAT current 134 are equal the output signal 136 of the differential amplifier 150 will be about midscale. In one example, when the PTAT current 132 is pushing more current than the CTAT current 134 is sinking, the output signal 136 will go to VREG (e.g., some positive value) and the output signal 136 will go to VNEG (e.g., some negative value) when the opposite is true.

The hysteresis circuit 154 ensures that when the output signal 136 indicates that a temperature has exceeded a temperature limit (e.g., too hot or too cold) that the output signal 136 continues to indicate a warning even when the temperature no longer exceeds the temperature limit for a particular temperature range. In one particular example, if the temperature exceeds a temperature limit of 100° C., the hysteresis circuit 154 ensures that the output signal 136 continues to indicate a warning until the temperature drops below 96° C.

Figure 7:
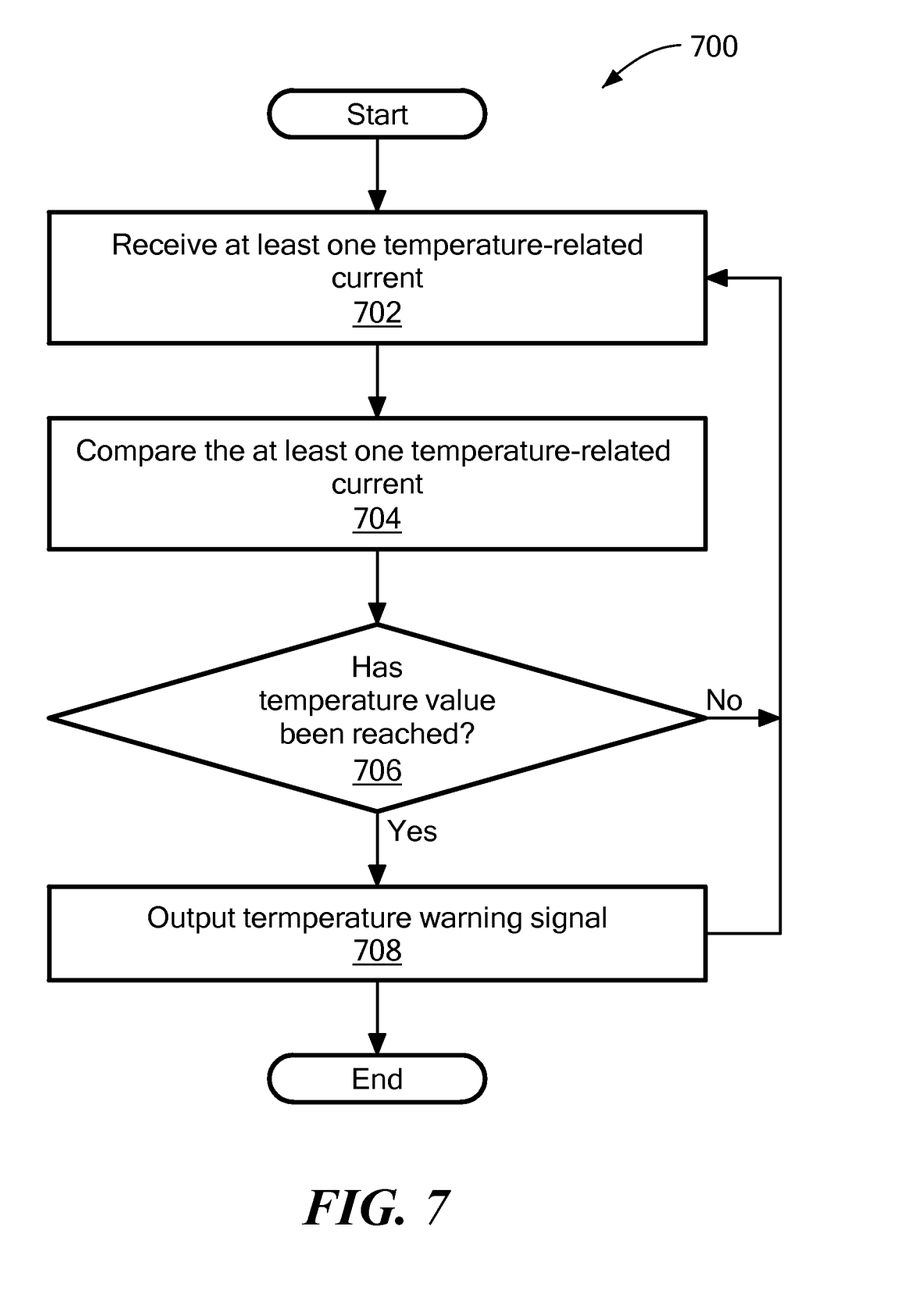
FIG. 7 is a flowchart of an example of a process to detect temperature.

Referring to FIG. 7, an example of a process to detect temperature is a process 700. Process 700 receives at least one temperature related current (702). For example, the PTAT current 132 and/or the CTAT current 134 is received. In another example, currents from two resistors with different temperature coefficients may be received.

Process 700 compares the at least one temperature-related current (704) and determines if a temperature value has been reached using the at least one temperature-related current (706). For example, the PTAT current 132 is compared to a reference voltage. In another example, the CTAT current 134 is compared to a reference voltage. In a further example, the PTAT current 132 and the CTAT current 134 are compared to each other. In one particular example, an on-chip reference such as the PTAT current 132 or the CTAT current 134 is compared to an externally provided reference, such as a flat supply voltage. If the temperature value has been reached, process 700 outputs a warning signal (708).

The processes described herein are not limited to the specific examples described. For example, the process 700 is not limited to the specific processing order of FIG. 7. Rather, any of the processing blocks of FIG. 7 may be re-ordered, combined or removed, performed in parallel or in serial, as necessary, to achieve the results set forth above.

The processing blocks (for example, in process 700) associated with implementing the system may be performed by one or more programmable processors executing one or more computer programs to perform the functions of the system. All or part of the process 700 may be implemented as, special purpose logic circuitry (e.g., an FPGA (field-programmable gate array) and/or an ASIC (application-specific integrated circuit)). All or part of the process 700 may be implemented using electronic hardware circuitry that include electronic devices such as, for example, at least one of a processor, a memory, a programmable logic device or a logic gate.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A temperature detection circuit comprising:
   a first circuit configured to provide a first signal to enable determination of a parameter of the magnetic sensor; and
   a comparator circuit configured to provide a warning signal in response to the first signal if a temperature reaches a temperature value,
   wherein the first circuit comprises a thermal voltage reference circuit configured to provide the first signal,
   wherein the thermal voltage reference circuit comprises a first transistor in parallel with a first resistor and a second transistor,
   wherein a first current across the first transistor is equal to a second current across the first resistor, and
   wherein a first voltage across the first transistor is equal to a second voltage across the first resistor and the second transistor.

2. The temperature detection circuit of claim 1, wherein the temperature detection circuit is disposed in the magnetic sensor.

3. The temperature detection circuit of claim 1, wherein the magnetic sensor is configured to detect movement of gear teeth.

4. The temperature detection circuit of claim 1, wherein the first circuit further comprises a junction voltage reference circuit configured to provide a second signal,
   wherein the junction voltage reference circuit comprises a third transistor in parallel with a second resistor,
   wherein the second resistor is substantially equal in temperature response as the first resistor,
   wherein a third current across the third transistor is equal to a fourth current across the second resistor, and
   wherein a third voltage across the second transistor is equal to a fourth voltage across the second resistor,
   wherein the comparator circuit is configured to provide a warning signal in response to the first signal and the second signal if a temperature reaches the temperature value.

5. The temperature detection circuit of claim 4, wherein the comparator circuit comprises:
   a differential amplifier configured to provide the warning signal;
   a summing circuit configured to receive the first signal and the second signal and to provide an input to the differential amplifier;
   a hysteresis circuit coupled to an output of the differential amplifier and coupled to the summing circuit; and
   a trim circuit coupled to the summing circuit and configured to provide trim.

6. A temperature detection circuit comprising:
   a first circuit configured to provide a first signal, wherein the first signal enables determination of a parameter of a magnetic sensor; and
   a comparator circuit configured to provide a warning signal in response to the first signal if a temperature reaches a temperature value,
   wherein the first circuit comprises a junction voltage reference circuit configured to provide the first signal,
   wherein the junction voltage reference circuit comprises a first transistor in parallel with a first resistor,
   wherein a first current across the first transistor is equal to a second current across the first resistor, and
   wherein a first voltage across the first transistor is equal to a second voltage across the first resistor.

7. The temperature detection circuit of claim 6, wherein the first circuit comprises a thermal voltage reference circuit configured to provide the first signal,
   wherein the thermal voltage reference circuit comprises a first transistor in parallel with a first resistor and a second transistor,
   wherein a first current across the first transistor is equal to a second current across the first resistor, and
   wherein a first voltage across the first transistor is equal to a second voltage across the first resistor and the second transistor.

8. The temperature detection circuit of claim 1, wherein the comparator circuit comprises:
   a differential amplifier configured to provide the warning signal; and
   a summing circuit configured to receive the second signal and to provide an input to the differential amplifier.

9. A temperature detection circuit comprising:
   a first circuit configured to provide a first signal to enable determination of a parameter of the magnetic sensor; and
   a comparator circuit configured to provide a warning signal in response to the first signal if a temperature reaches a temperature value,
   wherein the comparator circuit comprises:
      a differential amplifier configured to provide the warning signal; and
      a summing circuit configured to receive the second signal and to provide an input to the differential amplifier,
   wherein the comparator circuit further comprises a hysteresis circuit coupled to an output of the differential amplifier and the summing circuit.

10. The temperature detection circuit of claim 9, wherein the comparator circuit further comprises a trim circuit coupled to the summing circuit and configured to provide trim.

11. The temperature detection circuit of claim 1, wherein the parameter changes with changes in temperature and the parameter is a gain or a signal offset.

12. A magnetic sensor, comprising:
   a magnetic field sensing circuit comprising a magnetic field sensing element coupled to an electronic circuit configured to generate an output signal;
   a magnet configured to generate opposing magnetic fields;
   a first circuit configured to provide a first signal to enable determination of a parameter of the magnetic sensor; and
   a comparator circuit configured to provide a warning signal in response to the first signal if a temperature reaches a temperature value,
   wherein the magnetic sensor is configured to generate the output signal in response to the magnetic fields interacting with gear teeth, wherein the first circuit comprises a thermal voltage reference circuit configured to provide the second signal,
wherein the thermal voltage reference circuit comprises a first transistor in parallel with a first resistor and a second transistor,
wherein a first current across the first transistor is equal to a second current across the first resistor, and
wherein a first voltage across the first transistor is equal to a second voltage across the first resistor and the second transistor.

13. The magnetic sensor of claim 12, wherein the electronic circuit comprises the first circuit.

14. The magnetic sensor of claim 12, wherein the first circuit comprises a thermal voltage reference circuit configured to provide the second signal,
wherein the thermal voltage reference circuit comprises a first transistor in parallel with a first resistor and a second transistor,
wherein a first current across the first transistor is equal to a second current across the first resistor, and
wherein a first voltage across the first transistor is equal to a second voltage across the first resistor and the second transistor.

15. The magnetic sensor of claim 12, wherein the first circuit further comprises a junction voltage reference circuit configured to provide a second signal,
wherein the junction voltage reference circuit comprises a third transistor in parallel with a second resistor,
wherein the second resistor is substantially equal in temperature response as the first resistor,
wherein a third current across the third transistor is equal to a fourth current across the second resistor, and
wherein a third voltage across the second transistor is equal to a fourth voltage across the second resistor,
wherein the comparator circuit is configured to provide a warning signal in response to the first signal and the second signal if a temperature reaches the temperature value.

16. The magnetic sensor of claim 15, wherein the comparator circuit comprises:
a differential amplifier configured to provide the warning signal;
a summing circuit configured to receive the first signal and the second signal and to provide an input to the differential amplifier;
a hysteresis circuit coupled to an output of the differential amplifier and coupled to the summing circuit; and
a trim circuit coupled to the summing circuit and configured to provide trim.

17. A magnetic sensor, comprising:
a magnetic field sensing circuit comprising a magnetic field sensing element coupled to an electronic circuit configured to generate an output signal;
a magnet configured to generate opposing magnetic fields;
a first circuit configured to provide a first signal to enable determination of a parameter of the magnetic sensor; and
a comparator circuit configured to provide a warning signal in response to the first signal if a temperature reaches a temperature value,
wherein the magnetic sensor is configured to generate the output signal in response to the magnetic fields interacting with gear teeth,
wherein the first circuit comprises a junction voltage reference circuit configured to provide the second signal,
wherein the junction voltage reference circuit comprises a first transistor in parallel with a first resistor,
wherein a first current across the first transistor is equal to a second current across the first resistor, and
wherein a first voltage across the first transistor is equal to a second voltage across the first resistor.

18. The magnetic sensor of claim 12, wherein the comparator circuit comprises:
a differential amplifier configured to provide the warning signal; and
a summing circuit configured to receive the second signal and to provide an input to the differential amplifier.

19. A magnetic sensor, comprising:
a magnetic field sensing circuit comprising a magnetic field sensing element coupled to an electronic circuit configured to generate an output signal;
a magnet configured to generate opposing magnetic fields;
a first circuit configured to provide a first signal to enable determination of a parameter of the magnetic sensor; and
a comparator circuit configured to provide a warning signal in response to the first signal if a temperature reaches a temperature value,
wherein the magnetic sensor is configured to generate the output signal in response to the magnetic fields interacting with gear teeth,
wherein the comparator circuit comprises:
a differential amplifier configured to provide the warning signal; and
a summing circuit configured to receive the second signal and to provide an input to the differential amplifier,
wherein the comparator circuit further comprises a hysteresis circuit coupled to an output of the differential amplifier and the summing circuit.

20. The magnetic sensor of claim 19, wherein the comparator circuit further comprises a trim circuit coupled to the summing circuit and configured to provide trim.

21. The magnetic sensor of claim 12, wherein the parameter changes with changes in temperature and the parameter is a gain or a signal offset.

* * * * *

UNITED STATES PATENT AND TRADEMARK OFFICE
CERTIFICATE OF CORRECTION

PATENT NO. : 9,618,400 B2
APPLICATION NO. : 14/620533
DATED : April 11, 2017
INVENTOR(S) : Benjamin Geiger et al.

It is certified that error appears in the above-identified patent and that said Letters Patent is hereby corrected as shown below:

In the Specification

Column 1, Line 20, delete ", such a" and replace with --, such as a--

Column 1, Line 42, delete "circuit includes" and replace with --circuit that includes--

Column 1, Line 58, delete "is block" and replace with --is a block--

Column 1, Line 60, delete "of block" and replace with --of a block--

Column 1, Line 64, delete "is block" and replace with --is a block--

Column 1, Line 66, delete "is block" and replace with --is a block--

Column 2, Line 1, delete "is block" and replace with --is a block--

Column 3, Line 13, delete "sending" and replace with --sensing--

Column 3, Line 15, delete "PCT/EP2008056517," and replace with --PCT/EP2008/056517,--

Column 3, Line 41, delete "sending" and replace with --sensing--

Column 3, Line 52, delete "hear," and replace with --gear,--

Column 3, Line 67, delete "circuit 18 (In" and replace with --circuit 18. In--

Column 4, Line 4, delete "types)." and replace with --types.--

Column 4, Line 27, delete "FIG. 1 the" and replace with --FIG. 1, the--

Signed and Sealed this
Ninth Day of January, 2018

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,618,400 B2

Column 5, Line 58, delete "temperature the" and replace with --temperature, the--

Column 6, Line 21, delete "equal the" and replace with --equal, the--

Column 6, Line 30, delete "cold) that the" and replace with --cold) the--